United States Patent [19]

Kumagai et al.

[11] 4,402,998
[45] Sep. 6, 1983

[54] METHOD FOR PROVIDING AN ADHERENT ELECTROLESS METAL COATING ON AN EPOXY SURFACE

[75] Inventors: Henry Y. Kumagai, Lower Macungie Township, Lehigh County, Pa.; Daniel J. Shanefield, Princeton Township, Mercer County; Fred W. Verdi, Lawrence Township, Mercer County, both of N.J.

[73] Assignee: Western Electric Co., Inc., New York, N.Y.

[21] Appl. No.: 422,788

[22] Filed: Sep. 24, 1982

Related U.S. Application Data

[63] Continuation-in-part of Ser. No. 337,055, Jan. 4, 1982, abandoned.

[51] Int. Cl.³ .......................... H05K 3/18; H05K 3/42
[52] U.S. Cl. .................................. 427/97; 204/192 E; 204/192 EC; 204/192 C; 427/98; 427/99; 427/306; 427/316
[58] Field of Search ........ 204/192 E, 192 EC, 192 C; 427/97, 98, 304–306, 316, 99

[56] References Cited

U.S. PATENT DOCUMENTS

| | | | |
|---|---|---|---|
| 3,296,099 | 1/1967 | Dinella | 204/15 |
| 3,679,472 | 7/1972 | Crosby | 427/98 |
| 3,755,890 | 9/1973 | Klehm | 427/97 |
| 4,056,642 | 5/1976 | Saxena | 427/84 |
| 4,057,831 | 11/1977 | Jacobs | 204/192 E |
| 4,085,022 | 4/1978 | Wechsung | 204/192 E |
| 4,113,578 | 9/1978 | Del Monte | 204/192 R |
| 4,121,007 | 10/1978 | Kobayashi | 427/98 |
| 4,129,848 | 12/1978 | Frank | 204/192 EC |
| 4,135,988 | 1/1979 | Dugan | 427/97 |
| 4,148,945 | 4/1979 | Bangs | 427/304 |
| 4,153,529 | 5/1979 | Little | 204/192 EC |
| 4,160,045 | 7/1979 | Longshore | 427/38 |
| 4,166,018 | 8/1979 | Chapin | 204/192 R |
| 4,193,849 | 3/1980 | Sato | 204/15 |
| 4,285,800 | 8/1981 | Welty | 204/192 E |

FOREIGN PATENT DOCUMENTS

| | | | |
|---|---|---|---|
| 52-35866 | 3/1977 | Japan | 427/97 |
| 54-41990 | 12/1979 | Japan | 427/98 |

*Primary Examiner*—John D. Smith
*Attorney, Agent, or Firm*—J. F. Spivak

[57] ABSTRACT

A method of electrolessly plating a substrate having a rubber-modified epoxy surface includes the steps of preheating the substrate and while still warm, sputter etching at least 50A. from its surface. The substrate is then vacuum metalized with an adhesion promoting metal film, coated with a catalytic layer and a metal is electrolessly deposited thereover.

10 Claims, 3 Drawing Figures

METHOD FOR PROVIDING AN ADHERENT ELECTROLESS METAL COATING ON AN EPOXY SURFACE

CROSS-REFERENCE TO RELATED APPLICATIONS

This application is a continuation-in-part of my co-pending United States patent application, Ser. No. 337,055, filed Jan. 4, 1982, now abandoned entitled "Method of Providing an Adherent Electroless Metal Coating on an Epoxy Surface" and assigned to the assignee of this application.

TECHNICAL FIELD

This invention relates to the manufacture of electrolessly deposited adherent metal coatings on polymer surfaces and more particularly to the formation of such coatings on certain epoxy surfaces.

BACKGROUND OF THE INVENTION

In many applications, it is desirable to provide strong adherent metal layers on a polymer substrate. Examples of such uses are widely diversified. For example, adherent metal coatings on polymer substrates can be used in the manufacture of printed circuit boards or as a radio interference barrier. Such coatings also have applications in the manufacture of certain types of credit cards, video disks and for decorative coatings.

Various methods have been employed for providing metal coatings on polymer surfaces. Such methods include lamination by means of an adhesive, electroless plating, and vacuum metallization. The latter method includes vacuum evaporation, sputter deposition and ion plating. While vacuum metallization has become a desirable and cost efficient method of applying metallic coatings onto polymer substrates, the adhesion of such films to the substrates is often less than adequate, especially when metallizing durable high performance polymers such as epoxy resins. The adhesion problem often becomes particularly critical where the vacuum metallized layer is further processed by electroless metal plating or electroplating to increase the thickness of the metallized layer. In such cases, the adhesion of the vacuum metallized film must withstand the environment and temperatures of subsequently employed plating baths.

Shanefield and Verdi have recently discovered a novel method for vacuum depositing an adherent metal layer or film on a particular type of epoxy substrate. Unfortunately, when the substrate bearing the film was subsequently treated in electroless plating baths as are commonly used in the manufacture of printed circuit boards, blistering and delamination often occurred during the electroless plating. We have now discovered a modification of the Shanefield and Verdi process which prevents the blistering or delamination of the vacuum deposited films when subjected to electroless plating baths.

SUMMARY OF THE INVENTION

A substrate having a rubber-modified or highly unsaturated epoxy polymeric surface is first baked at elevated temperatures to remove surface gases. While the substrate is still warm, it is placed in a vacuum apparatus and is sputter etched in the presence of an inert gas so as to remove at least 50 A. from the surface. A thin adherent base metal film of chromium is then vacuum deposited on the treated surface. This thin layer acts as an adhesion promoting layer for a thicker film of a primary metal which is electrolessly deposited over the thin base film.

The metallized surface as described above may be provided as a blanket metallization over the entire surface of the substrate or may be provided over only portions of the substrate so as to depict a predetermined metallized pattern on the substrate. Alternatively, a pattern may be formed by various processing steps well known in the art subsequent to either a blanket vacuum deposition of the thin base film or subsequent to blanket electroless plating over the thin base film.

DETAILED DESCRIPTION

Figure 1A:
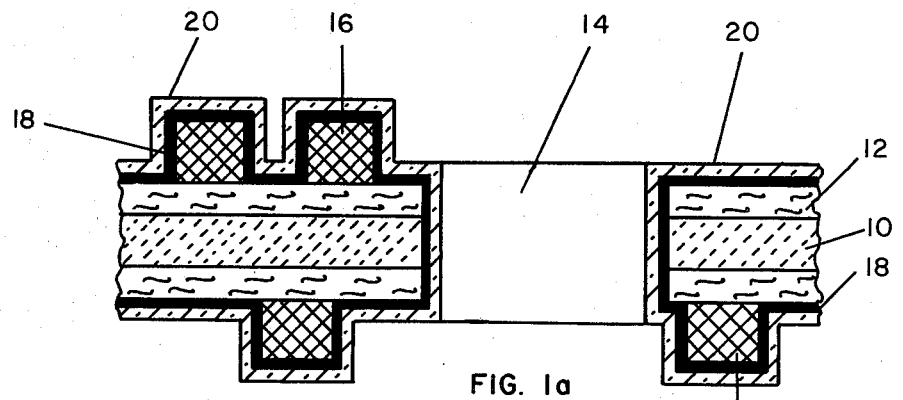
FIGS. 1a-1c are partial elevational, cross-sectional views of a printed circuit board at various steps during the maufacturing process.
Figure 1B:
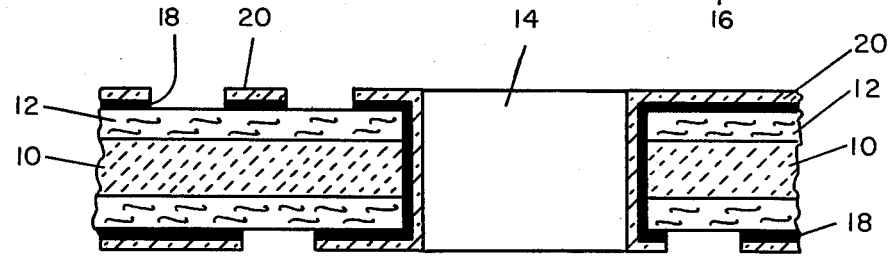
Figure 1C:
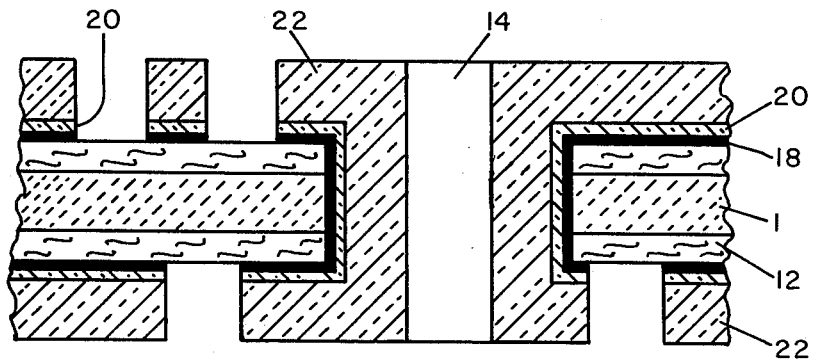

For convenience, the invention will be described in terms of preparing a printed circuit board by means of additive processing. However, it should be understood that the invention extends to many other uses other than printed circuit boards and is suitable for any use wherein an electrolessly deposited adherent metal coating is applied over a suitable epoxy polymeric substrate.

According to Shanefield and Verdi, a surface layer comprising a rubber-modified epoxy resin or a highly unsaturated epoxy resin is first treated so as to remove any weak boundary layers from the surface such as by sputter etching at least 50 A. from the surface, and then a thin adherent base film of a metal selected from the group consisting of Ti, Ni, Ni-V alloy, Cr, Pd or Pt is vacuum deposited, such as by sputtering, vacuum evaporation, or ion plating, and then a thicker coating is applied such as by means of vacuum metallization or electroplating techniques or a combination thereof, finally an adherent thick metal layer which as a 90° peel strength of at least 8 pounds per inch can be formed over the substrate. It was unexpectedly discovered, however, that when the final metal coating was applied utilizing commercially available electroless plating baths, the metallized layers often lost their adhesion during the electroless metal buildup. In many cases the metals blistered during electroless deposition and peel strengths were less than 5 pounds per inch even after baking subsequent to the deposition, which baking ordinarily tends to enhance adhesion. Attempts to cure this problem by altering electroless plating bath compositions were unsuccessful. We have now unexpectedly discovered that this reduction of adhesion during electroless plating can be substantially alleviated when Cr is used as the adherent base film by baking the substrate at elevated temperatures, such as in air or in vacuum at about 120° C. for about 30 minutes, prior to sputter etching provided the substrate, if not already in the sputter etch apparatus, is placed in vacuum in the sputter etching apparatus while still warm. It is hypothesized that this baking removes adsorbed gases from the surface of the substrate which gases cause a reduction of adhesion during subsequent processing steps, i.e., electroless deposition. By placing the still warm substrate in the sputtering apparatus subsequent to baking and pumping down prior to complete cooling, gases can be prevented from readsorbing on the surface. It is interesting to note that experiments performed to seek alternative ways to remove adsorbed gases prior to sputtering as a solution for the blistering problem encountered during electroless plating failed to result in electroless films having good adhesion. For example, placing the substrate in a desiccator for one week at room temperature as a preliminary treatment did not provide adequate adhesion. Similarly, placing the substrate for an extended period, such as three hours, in a high vacuum such as $10^{-6}$ Torr at room temperature also did not alleviate the adhesion problem encountered during electroless deposition. Further, it has unexpectedly been discovered that a unique synergism exists whereby the pre-bake operates to enhance the adhesion through electroless plating only when Cr is used as the adherent base film. If any of the other base film metals taught by Shanefield-Verdi are employed, e.g., Ti, Ni, Ni-V, Pt or Pd, the pre-bake does not result in any significant improvement in the problem encountered during electroless plating. Consequently, whenever electroless plating is used to further build up the thickness of the metal pattern, a pre-bake is essential in order to obtain consistent and uniform adhesion.

As further set forth by Shanefield and Verdi in their co-pending application, the results of superior adhesion by means of vacuum metallization are only achieved on rubber-modified epoxy surfaces or highly unsaturated epoxy surfaces. Attempts to metallize other polymer substrates such as, epoxies without rubber, epoxies not having a high degree of unsaturation (at least 5.5%), polycarbonates, acrylonitrile-butadiene-styrene, lacquers and polyacrylates using this method was unsuccessful. Unless the rubber-modified or highly unsaturated epoxy surfaces were treated as set forth by Shanefield and Verdi, these surfaces were not amenable to vacuum metallization of adherent films having peel strengths in the order of at least 8 pounds per inch.

An example of a suitable rubber-modified epoxy resin is one which contains butadiene-acrylonitrile rubber in the formulation. The rubber is generally present as a dispersed separate phase in the epoxy. Rubber-modified epoxies are well known in the printed circuit art and a suitable rubber-modified epoxy may, for example, be selected from the compositions disclosed by R. B. Lewis and T. A. Giversen in U.S. Pat. No. 4,176,142 which is incorporated herein by reference.

An example of a highly unsaturated epoxy is one that has at least 5½ weight percent carbon-to-carbon double bonds based upon the total weight of the polymer excluding phenyl ring unsaturated carbon atoms, e.g., Epon 872, a commercially available epoxy resin flexibilized by pre-reaction with dimer acid which has unsaturation and is incorporated in the polymer chain. One such dimer acid has the formula

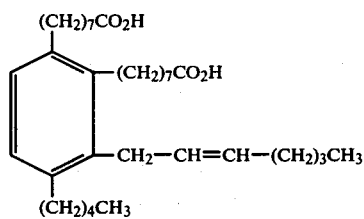

In using the novel process, not only is it imperative to utilize a pre-bake as set forth above with a vacuum metallized Cr base film, but also, it is important that at least about 50 A. of the surface should be etched by means of sputter etching in an inert atmosphere such as argon.

The thin adherent Cr base film which is vacuum deposited subsequent to sputter etching is generally deposited to a thickness in the order of 1,000 A. and typically from 100 to 3,000 A. However, films of up to 10,000 A. are suitable.

As an example of the novel method used for the manufacture of a printed circuit board, one starts with a substrate member 10 such as an epoxy or fiberglass-epoxy member which is coated with a thin rubber-modified epoxy coating 12 on its surface. Typically, this coating is about 0.002 inches thick. The rubber-modified epoxy coated substrate is then drilled and deburred so as to form a plurality of spaced through-holes 14 in the substrate 10. A resist pattern 16 is formed on the substrate surface conforming to the negative of the desired circuit pattern. The process for forming such resist patterns is well known in the printed circuit board art and need not be specifically set forth herein. The substrate 10 is then baked in air at an elevated temperature for a time which is sufficient to degas the surface, e.g., 120° C. for 30 minutes and while still warm it is placed in a vacuum chamber which is evacuated before the substrate cools down. Generally, a vacuum of about $10^{-6}$ Torr is produced and argon gas is then bled back into the system to a pressure of from 5 to 100 microns. The substrate is then sputter etched so as to remove at least 50 A. from the surface of the patterned substrate. Subsequent to sputter etching and without breaking the vacuum, a thin adhesion promoting chromium metal layer 18 is then deposited over the entire substrate in a thickness typically of about 1 microinch. This step is followed by the vacuum deposition, e.g., sputtering, of a thin layer of a metal 20 which is catalytic to the electroless plating bath to be used. Typically, this catalytic metal layer 20 is about 10 microinches in thickness and is generally comprised of copper. It may be noted that this copper layer 20 may alternatively be applied by flash electroless plating techniques instead of vacuum deposition if desired and if the underlying thin layer 18 will catalyze the copper deposition. Also, other metals such as nickel, can be used in place of copper. Only 10 microinches of copper 20 are necessary since electrical conductivity is not of import due to the fact that electroless plating will be employed to buildup the final desired thickness. Subsequent to this thin copper 20 deposition, the photoresist 16 is then stripped so as to remove the thin metal layers 18 and 20 from regions overlying the resist 16. In so during, the vacuum metallized adhesion promoting layer 18 and copper layer 20 thereover are not removed from the regions where there was no resist, thereby leaving the desired printed circuit pattern. The thickness of the remaining metal is then built up to the full desired thickness of approximately 0.0014 inches by an electroless copper 22 deposit. Any thickness which gives suitable electrical conductivity for the printed circuit board is of course suitable. Printed circuit boards made in accordance with this invention generally exhibit 90° peel strengths of at least 8 pounds per inch.

In the manufacture of printed circuit boards as set forth above, the vacuum deposited metals are generally formed by means of sputtering. Either RF or DC sputtering may be employed and DC magnetron sputtering is preferred. Commercially available sputtering apparatus include means for moving the substrate in the apparatus from one position to another position while maintaining the desired vacuum such that the substrate can be moved between different pairs of electrodes so as to first sputter etch and then sputter deposit different materials. When sputter etching, stainless steel anodes and cathodes were employed, the cathode having a thin coating of one of the metals to be subsequently sputter deposited so as not to cause contamination of the vacuum chamber. Typically, for RF sputter etching, a wattage in the order of 500 watts at 13 to 14 MHz with an argon pressure of from 5 to 100 microns (approximately 10 microns being preferred) is suitable. Usual etch times in order to etch at least 50 A. from the surface are approximately three minutes under these conditions. Typical parameters useful for sputter deposition or other vacuum deposition techniques may be found with reference to U.S. Pat. No. 4,166,018 issued to J. S. Chapin or by reference to "Vacuum Metalizing," Metal Finishing, by P. R. Forant, November, 1979, pages 17-20 both of which are incorporated herein by reference. The specific parameters used for sputter etching and sputter deposition or other vacuum deposition is not critical, and a wide variety of parameters are suitable. Similarly, the thicknesses of the adherent metal film and overlying vacuum deposited or flash electrolessly plated film is not critical.

It may be noted that it has been found to be preferred in order to obtain better through coverage, that the substrate be raised from its carrier plate during sputter etching and deposition so as to provide more uniform metallization within the through-holes. Typically, a space of from ¼ to ⅜ of an inch is preferred.

It is to be understood that the above-described embodiments are simply illustrative of the principles of the invention. Various other modifications and changes may be devised by those skilled in the art which will embody the principles of the invention and fall within the spirit and scope thereof.

What is claimed is:

1. A method of forming an adherent electrolessly deposited film on a rubber-modified epoxy resin surface or a surface comprising an epoxy resin having a high degree of unsaturation excluding aromatic unsaturation, comprises the steps of:
   (a) baking the substrate so as to degas the surface, and while still warm subjecting the substrate to a vacuum;
   (b) while evacuated, sputter etching at least 50 A. from the surface of the substrate;
   (c) vacuum metallizing an adherent thin metallic chromium film over the substrate;
   (d) depositing a second metallic layer which is catalytic to a subsequent electroless deposition over the adherent metal film; and
   (e) electrolessly plating a thick metallic layer over the metallized portions of the substrate.

2. The method recited in claim 1, wherein the adherent thin metallic film is in the order of about 1 microinch thick and the catalytic metallic layer thereover is in the order of about 10 microinches in thickness.

3. The method recited in claim 1, wherein the substrate is baked at elevated temperatures in the order of about 120° C. in air.

4. The method recited in claim 1, wherein the metallic layers are sputter deposited onto the etched substrate.

5. The method recited in claim 1, wherein the catalytic metal is copper or nickel.

6. A method of forming a printed circuit board on a substrate having a plurality of spaced through-holes and a substrate surface comprising a rubber-modified epoxy resin or an epoxy resin having a high degree of unsaturation excluding aromatic unsaturation comprising the steps of:
   (a) forming a resist pattern on the substrate conforming to the negative of the desired circuit pattern;
   (b) baking the substrate so as to degas the surface and while still warm subjecting the substrate to a vacuum;
   (c) sputter etching at least 50 A. from the surface of the patterned substrate;
   (d) vacuum metallizing an adherent thin metallic chromium film over the entire substrate;
   (e) depositing a thicker primary metallic layer which is catalytic to subsequent electroless deposition over the adherent metallic film;
   (f) stripping the photoresist together with its overlying metal films; and
   (g) electrolessly plating a thick metallic layer over the remaining metallic pattern in a thickness sufficient to give suitable electrical conductivity.

7. The method recited in claim 6, wherein the adherent thin metallic film is in the order of about 1 microinch thick and the primary metallic layer thereover is in the order of about 10 microinches in thickness.

8. The method recited in claim 6, wherein the primary metallic layer is electrolessly plated over the adherent thin metallic film which film is catalytic to the electroless plating.

9. The method recited in claim 6, wherein the substrate is baked in air at about 120° C.

10. The method recited in claim 6, wherein the substrate is supported on a carrier plate during vacuum etching and deposition in a manner so as to be raised from the carrier plate by between ¼ and ⅜ inch.

* * * * *